(12) United States Patent
Hatano et al.

(10) Patent No.: US 11,990,357 B2
(45) Date of Patent: May 21, 2024

(54) SUBSTRATE TRANSPORT APPARATUS, SUBSTRATE TRANSPORT METHOD, AND SUBSTRATE PROCESSING SYSTEM

(71) Applicant: TOKYO ELECTRON LIMITED, Tokyo (JP)

(72) Inventors: Tatsuo Hatano, Yamanashi (JP); Naoki Watanabe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 132 days.

(21) Appl. No.: 17/571,171

(22) Filed: Jan. 7, 2022

(65) Prior Publication Data

US 2022/0130701 A1 Apr. 28, 2022

(30) Foreign Application Priority Data

Jan. 12, 2021 (JP) ................. 2021-002595

(51) Int. Cl.
*H01L 21/677* (2006.01)
*H01L 21/67* (2006.01)
*H01L 21/683* (2006.01)

(52) U.S. Cl.
CPC .. *H01L 21/67742* (2013.01); *H01L 21/67196* (2013.01); *H01L 21/67709* (2013.01); *H01L 21/6838* (2013.01); *H02K 2201/18* (2013.01)

(58) Field of Classification Search
CPC ......... H01L 21/67742; H01L 21/67196; H01L 21/67709; H01L 21/6838
See application file for complete search history.

(56) References Cited

U.S. PATENT DOCUMENTS

| 5,377,596 A * | 1/1995 | Ono ................. H01L 21/67709 104/284 |
| 6,437,463 B1 * | 8/2002 | Hazelton ............. G03F 7/70758 310/12.13 |
| 10,056,279 B2 | 8/2018 | Janakiraman et al. |
| 10,734,265 B2 | 8/2020 | Janakiraman et al. |
| 11,430,683 B2 | 8/2022 | Raatz et al. |

(Continued)

FOREIGN PATENT DOCUMENTS

JP 06120317 A * 4/1994
JP H06-120317 A 4/1994

(Continued)

*Primary Examiner* — Gerald McClain
(74) *Attorney, Agent, or Firm* — Fenwick & West LLP

(57) ABSTRACT

A substrate transport apparatus which transports a substrate to a substrate transport position. The apparatus comprises: a transport unit including a substrate holder that holds the substrate, a base having magnets and configured to move the substrate holder, and a link member connecting the substrate holder to the base; and a planar motor having a main body, electromagnetic coils arranged in the main body, and a linear driver supplying power to the electromagnetic coils to magnetically levitate and linearly drive the base. The base includes a first member and a second member rotatably provided in the first member, and the magnets are provided inside the first member and the second member, the link member is rotatably connected to the second member, and the linear driver rotates the second member with respect to the first member and expands and contracts the substrate holder via the link member.

16 Claims, 9 Drawing Sheets

(56) References Cited

U.S. PATENT DOCUMENTS

| | | | |
|---|---|---|---|
| 2003/0217668 A1* | 11/2003 | Fiske | B60L 13/04 |
| | | | 104/282 |
| 2014/0265690 A1* | 9/2014 | Henderson | H02N 15/00 |
| | | | 310/90.5 |
| 2016/0218029 A1 | 7/2016 | Janakiraman et al. | |
| 2018/0308735 A1 | 10/2018 | Janakiraman et al. | |
| 2019/0348898 A1* | 11/2019 | Frangen | B65G 54/02 |
| 2021/0249291 A1* | 8/2021 | Raatz | H01L 21/67724 |
| 2021/0265188 A1* | 8/2021 | Moura | H02N 15/00 |
| 2022/0037181 A1* | 2/2022 | Hatano | H01L 21/67742 |
| 2022/0223447 A1* | 7/2022 | Hatano | H01L 21/67742 |
| 2022/0285191 A1* | 9/2022 | Li | H01L 21/68707 |
| 2023/0143372 A1* | 5/2023 | Matsumoto | H05B 1/0233 |
| | | | 414/804 |

FOREIGN PATENT DOCUMENTS

| | | | | |
|---|---|---|---|---|
| JP | 2017-168866 A | 9/2017 | | |
| JP | 2018-504784 A | 2/2018 | | |
| JP | 2021086986 A | * 6/2021 | | B25J 11/0095 |
| KR | 10-2017-0106464 A | 9/2017 | | |
| WO | WO 2016/118335 A1 | 7/2016 | | |
| WO | WO 2019/238416 A1 | 12/2019 | | |

* cited by examiner

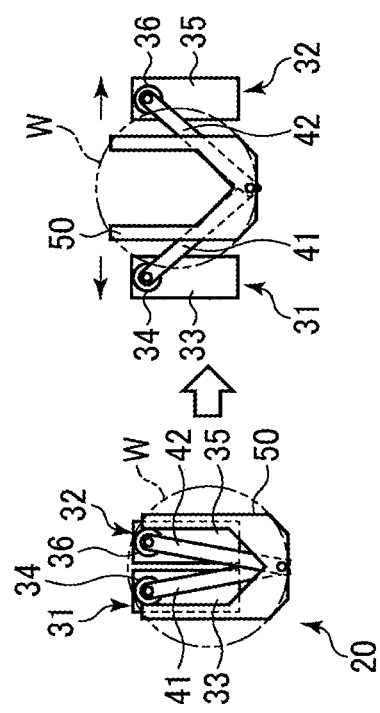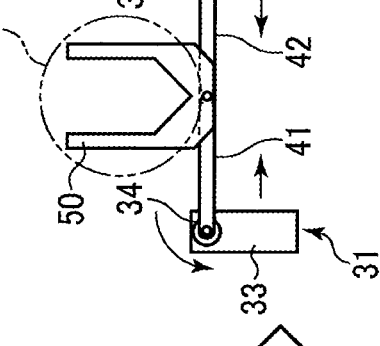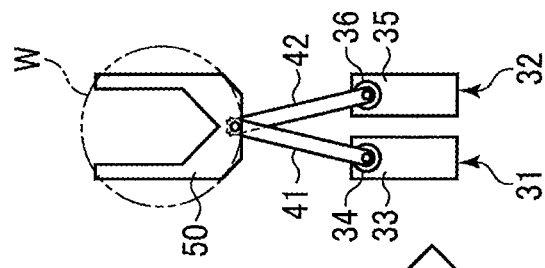

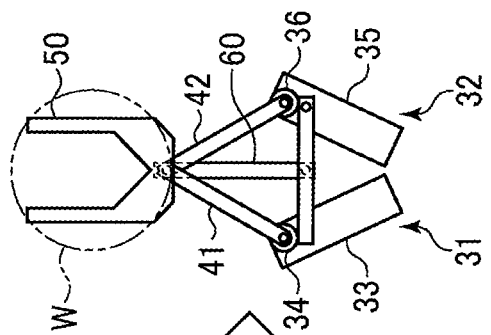
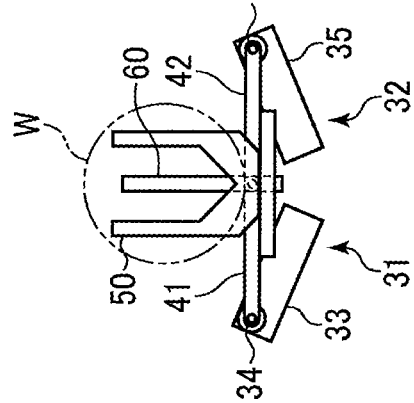
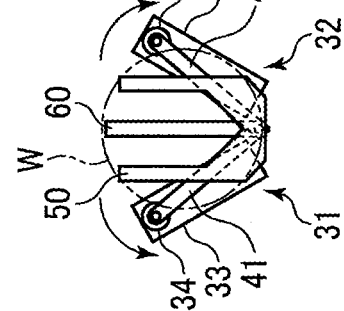
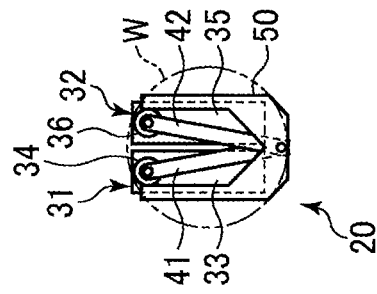

SUBSTRATE TRANSPORT APPARATUS, SUBSTRATE TRANSPORT METHOD, AND SUBSTRATE PROCESSING SYSTEM

CROSS-REFERENCE TO RELATED APPLICATIONS

This application claims priority to Japanese Patent Application No. 2021-002595 filed on Jan. 12, 2021, the entire contents of which are incorporated herein by reference.

TECHNICAL FIELD

The present disclosure relates to a substrate transport apparatus, a substrate transport method, and a substrate processing system.

BACKGROUND

For example, in a semiconductor manufacturing process, when a semiconductor wafer as a substrate is processed, a substrate processing system including a plurality of processing chambers, a vacuum transport chamber connected to the processing chambers, and a substrate transport apparatus provided in the vacuum transport chamber is used.

As such a substrate transport apparatus, a transport robot having an articulated arm structure has been conventionally used (for example, see Japanese Patent Application Publication No. 2017-168866).

Further, as a technology which can solve a problem of gas intrusion from a vacuum seal and a problem that rotation and expansion and contraction movement of the transport robot are limited in the technology using the transport robot, a substrate transport apparatus with a planar motor using magnetic levitation has been proposed (for example, see Japanese Patent Application Publication No. 2018-504784).

SUMMARY

The present disclosure provides a substrate transport apparatus, a substrate transport method, and a substrate processing system capable of reducing the area exclusively occupied by a transport unit including a substrate holder in substrate transport using a planar motor.

In accordance with an aspect of the present disclosure, there is provided a substrate transport apparatus which transports a substrate to a substrate transport position. The apparatus comprises: a transport unit including a substrate holder configured to hold the substrate, a base having a plurality of magnets therein and configured to move the substrate holder, and a link member configured to connect the substrate holder to the base; and a planar motor having a main body, a plurality of electromagnetic coils arranged in the main body, and a linear driver configured to supply power to the electromagnetic coils to magnetically levitate and also linearly drive the base. The base includes a first member and a second member rotatably provided in the first member, and the magnets are provided inside the first member and the second member, the link member is rotatably connected to the second member, and the linear driver rotates the second member with respect to the first member and expands and contracts the substrate holder via the link member.

BRIEF DESCRIPTION OF THE DRAWINGS

FIGS. 8A to 8D are diagrams for explaining an extension operation of an end effector.

FIGS. 9A to 9D are diagrams for explaining the extension operation of the end effector when a guide member is provided.

DETAILED DESCRIPTION

Hereinafter, embodiments will be described with reference to the accompanying drawings.

<Example of Substrate Processing System>

Figure 1:
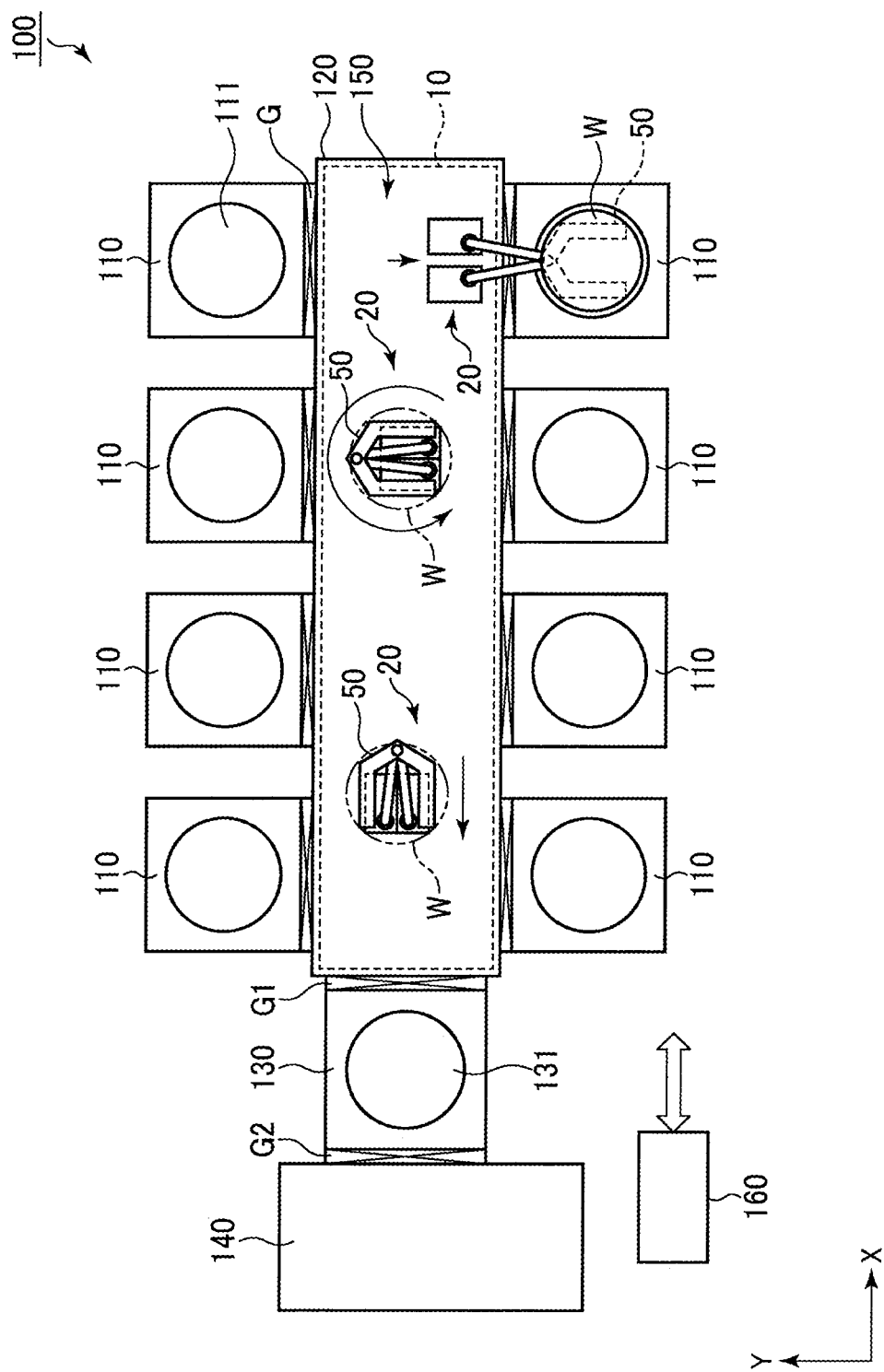
FIG. 1 is a schematic plan view showing an example of a substrate processing system.

FIG. 1 is a schematic plan view showing an example of a substrate processing system.

The substrate processing system 100 of this example continuously processes a plurality of substrates. The processing of the substrates is not particularly limited, and examples thereof include various processes such as a film forming process, an etching process, an ashing process, and a cleaning process. The substrate is not particularly limited, but in the following description, a case in which a semiconductor wafer (hereinafter, also simply referred to as a wafer) is used as the substrate will be described as an example.

As shown in FIG. 1, the substrate processing system 100 is a cluster structure (multi-chamber type) system and includes a plurality of processing chambers 110, a vacuum transport chamber 120, a load lock chamber 130, an atmospheric transport chamber 140, a substrate transport apparatus 150, and a controller 160.

The vacuum transport chamber 120 has a rectangular planar shape, the inside thereof being depressurized to a vacuum atmosphere, and the plurality of processing chambers 110 are connected to wall portions facing each other on the long side via a gate valve G. Further, the load lock chamber 130 is connected to one wall portion on the short side of the vacuum transport chamber 120 via a gate valve G1. The atmospheric transport chamber 140 is connected to the side of the load lock chamber 130 opposite to the vacuum transport chamber 120 via a gate valve G2. In FIG. 1, an arrangement direction of the processing chambers 110 is an X direction, and a direction orthogonal to the X direction is a Y direction. Further, although FIG. 1 shows a case in which there is one load lock chamber 130, there may be a plurality of load lock chambers 130.

The substrate transport apparatus 150 in the vacuum transport chamber 120 performs loading and unloading of a wafer W, which is a substrate, into and from the processing chamber 110 and the load lock chamber 130. The substrate transport apparatus 150 includes a transport unit 20 having an end effector 50 which is a wafer holder that actually holds the wafer W. Details of the substrate transport apparatus 150 will be described later.

The processing chamber 110 and the vacuum transport chamber 120 communicate with each other by opening the gate valve G so that the wafer W can be transported by the substrate transport apparatus 150, and the communication therebetween is blocked by closing the gate valve G. Further, the load lock chamber 130 and the vacuum transport chamber 120 communicate with each other by opening the gate valve G1 so that the wafer W can be transported by the substrate transport apparatus 150, and the communication therebetween is blocked by closing the gate valve G1.

The processing chamber 110 has a mounting table 111 on which the wafer W is mounted, and performs a desired process (a film formation process, an etching process, an ashing process, a cleaning process, or the like) on the wafer W mounted on the mounting table 111 in a state in which the inside thereof is depressurized to a vacuum atmosphere.

The load lock chamber 130 includes a mounting table 131 on which the wafer W is mounted, and serves to control a pressure between atmospheric pressure and vacuum when the wafer W is transported between the atmospheric transport chamber 140 and the vacuum transport chamber 120.

The atmospheric transport chamber 140 has an atmospheric atmosphere, and for example, a downflow of clean air is formed therein. Further, a load port (not shown) is provided in a wall surface of the atmospheric transport chamber 140. The load port is configured so that a carrier (not shown) containing the wafer W or an empty carrier is connected thereto. As the carrier, for example, a front opening unified pod (FOUP) or the like can be used.

Further, an atmospheric transport device (not shown) for transporting the wafer W is provided inside the atmospheric transport chamber 140. The atmospheric transport device takes out the wafer W accommodated in the load port (not shown) and mounts the wafer W on the mounting table 131 of the load lock chamber 130, or takes out the wafer W mounted on the mounting table 131 of the load lock chamber 130 and accommodates the wafer W in the load port. The load lock chamber 130 and the atmospheric transport chamber 140 communicate with each other by opening the gate valve G2 so that the wafer W can be transported by the atmospheric transport device, and the communication therebetween is blocked by closing the gate valve G2.

The controller 160 is configured as a computer and includes a main controller equipped with a central processing unit (CPU), an input device, an output device, a display device, and a storage device (a storage medium). The main controller controls an operation of each of the constituent parts of the substrate processing system 100. For example, the processing of the wafer W in each of the processing chambers 110, the transport of the wafer W by the substrate transport apparatus 150, the opening and closing of the gate valves G, G1 and G2, and the like are controlled. The control of each of the constituent parts by the main controller is performed based on a processing recipe which is a control program stored in a storage medium (a hard disk, an optical disc, a semiconductor memory, or the like) built in the storage device.

Next, an example of the operation of the substrate processing system 100 will be described. In the specification, an operation in which the wafer W accommodated in the carrier installed in the load port is processed in the processing chamber 110 and is then accommodated in the empty carrier installed in the load port will be described as an example of the operation of the substrate processing system 100. The following operations are performed based on the processing recipe of the controller 160.

First, the wafer W is taken out of the carrier connected to the load port by the atmospheric transport device (not shown) in the atmospheric transport chamber 140, the gate valve G2 is opened, and the wafer W is loaded into the load lock chamber 130 in the atmospheric atmosphere. Then, after the gate valve G2 is closed, the load lock chamber 130 into which the wafer W has been loaded is brought into a vacuum state corresponding to the vacuum transport chamber 120. Next, the corresponding gate valve G1 is opened, the wafer W in the load lock chamber 130 is taken out by the end effector 50 of the transport unit 20, and then the gate valve G1 is closed. Next, after the gate valve G corresponding to any of the processing chambers 110 is opened, the wafer W is loaded into the processing chamber 110 by the end effector 50 and is mounted on the mounting table 111. Then, after the end effector 50 is contracted from the processing chamber 110 and the gate valve G is closed, a process such as a film formation process is performed in the processing chamber 110.

After the processing in the processing chamber 110 is completed, the corresponding gate valve G is opened, and the end effector 50 of the transport unit 20 takes the wafer W out of the processing chamber 110. Then, after the gate valve G is closed, the gate valve G1 is opened, and the wafer W held by the end effector 50 is transported to the load lock chamber 130. Thereafter, after the gate valve G1 is closed and the load lock chamber 130 into which the wafer W has been loaded is made into the atmospheric atmosphere, the gate valve G2 is opened, and the wafer W is taken out of the load lock chamber 130 by the atmospheric transport device (not shown) and is accommodated in the carrier of the load port (neither is shown).

The above-described processing is performed on a plurality of wafers W in parallel, and the processing is performed on all the wafers W in the carrier.

In addition, in the above description, a case of parallel transport in which the wafer W is transported to one of the processing chambers 110 by the substrate transport apparatus 150, and while the wafer W is being processed in said one processing chamber 110, another wafer W is transported to another of the processing chambers 110 has been described, but the present disclosure is not limited thereto. For example, it may be serial transport in which one wafer W is sequentially transported to the plurality of processing chambers 110.

<Example of Substrate Transport Apparatus>

Figure 2:
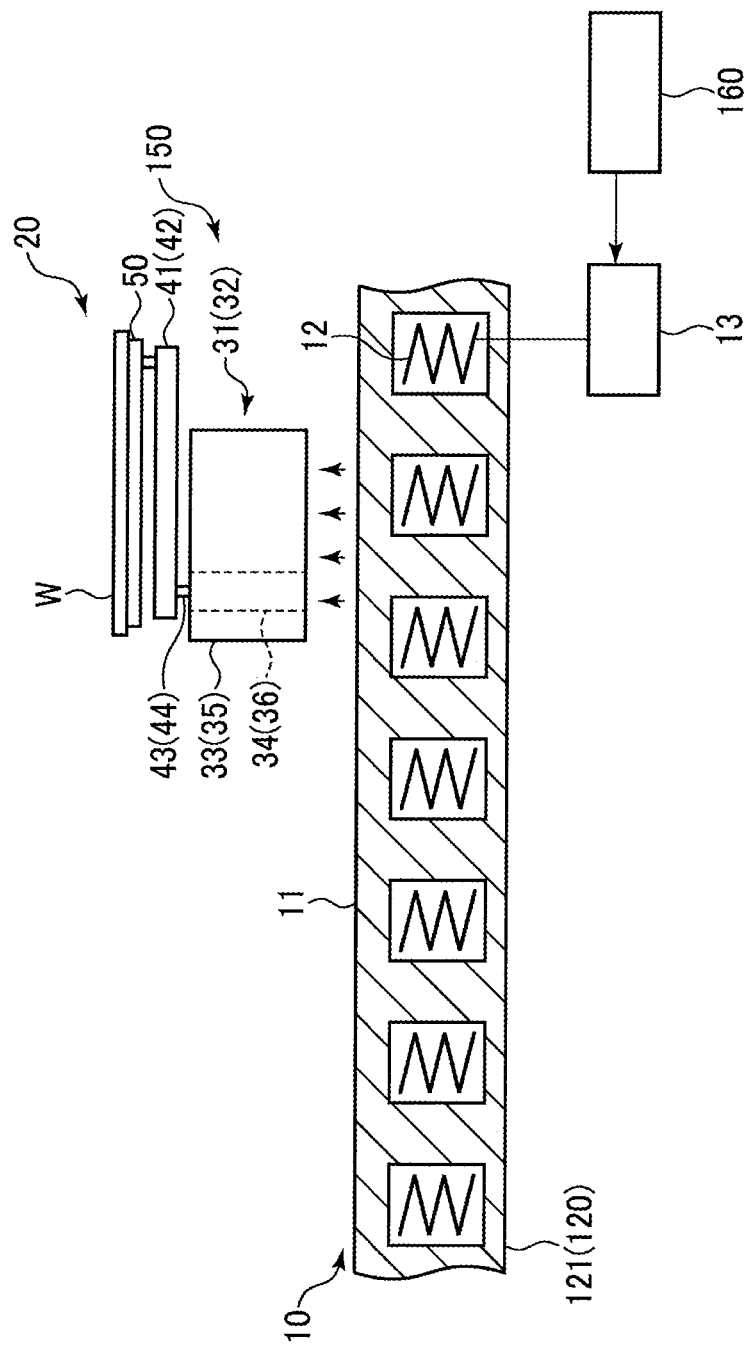
FIG. 2 is a partial cross-sectional side view for describing a transport unit and a planar motor of a substrate transport apparatus.
Figure 3:
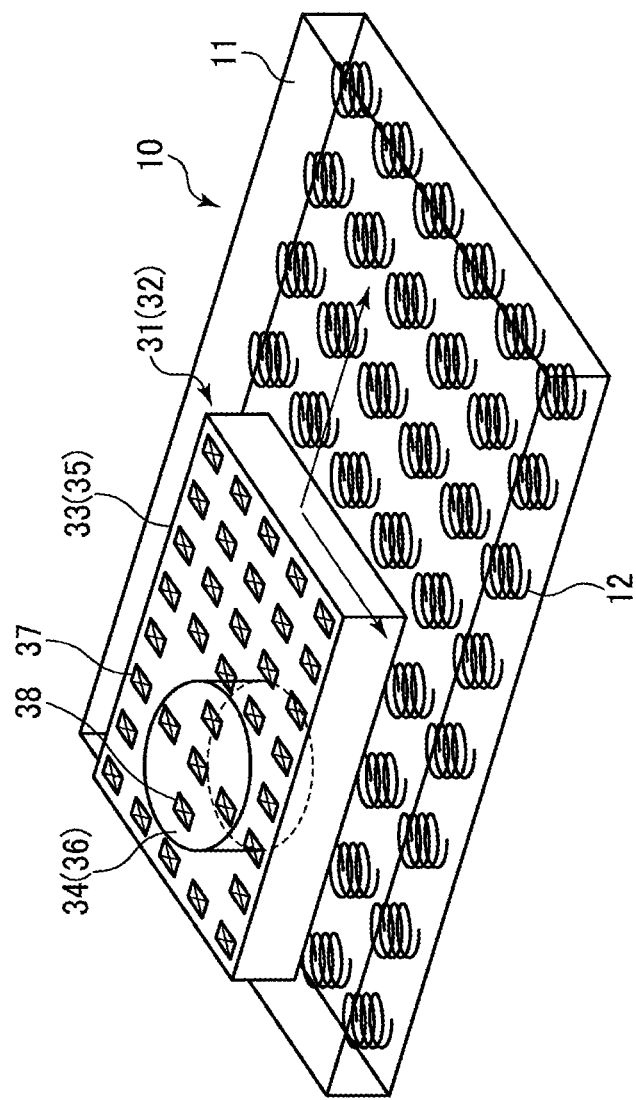
FIG. 3 is a perspective view for explaining a driving principle of the planar motor.
Figure 4A:
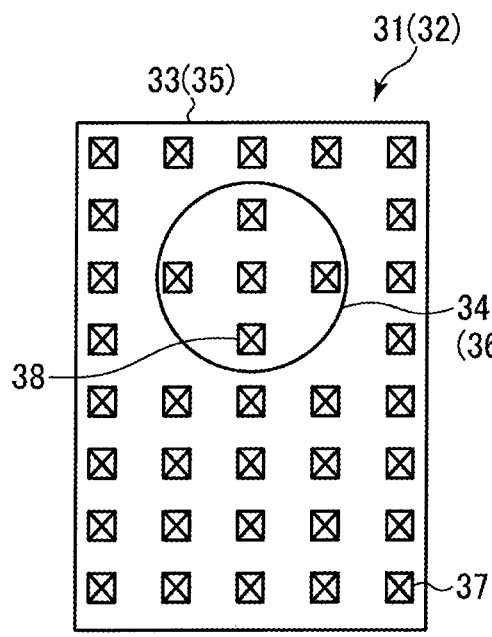
FIGS. 4A and 4B are diagrams for explaining rotation of a second member with respect to a first member in a base.
Figure 4B:
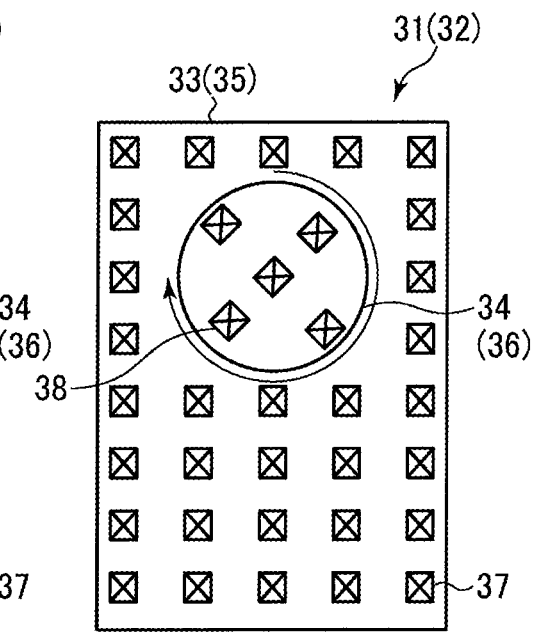
Figure 5:
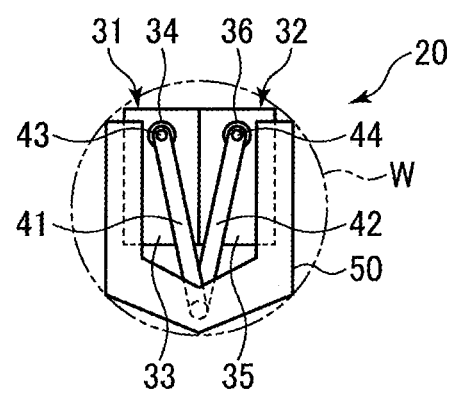
FIG. 5 is a plan view showing a state in which the transport unit is contracted.
Figure 6:
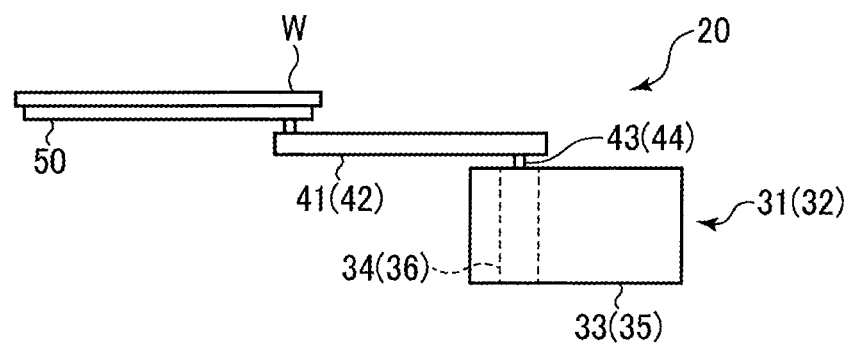
FIG. 6 is a side view showing a state in which the transport unit is extended.
Figure 7:
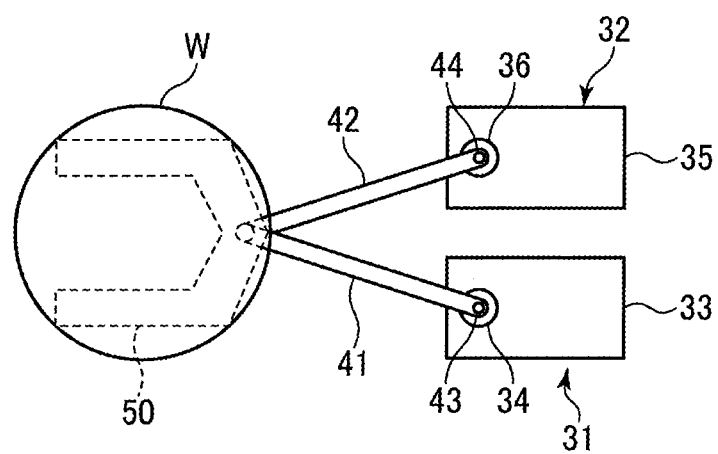
FIG. 7 is a plan view showing the state in which the transport unit is extended.

Next, an example of the substrate transport apparatus will be described in detail with reference to FIGS. 2 to 7 in addition to FIG. 1 described above. FIG. 2 is a partial cross-sectional side view for explaining the transport unit and the planar motor of the substrate transport apparatus, FIG. 3 is a perspective view for describing a driving principle of the planar motor, FIGS. 4A and 4B are diagrams for explaining the rotation of a second member with respect to a first member in a base, FIG. 5 is a plan view showing a state in which the transport unit is contracted, FIG. 6 is a side view showing a state in which the transport unit is extended, and FIG. 7 is a plan view showing the state in which the transport unit is extended.

As shown in FIGS. 1 and 2, the substrate transport apparatus 150 includes a planar motor (a linear unit) 10 and the transport unit 20.

The planar motor (the linear unit) 10 linearly drives the transport unit 20. The planar motor (linear unit) 10 includes a main body 11 constituting a bottom wall 121 of the vacuum transport chamber 120, a plurality of electromagnetic coils 12 disposed throughout the inside of the main body 11, and a linear driver 13 which supplies power to each of the plurality of electromagnetic coils 12 to linearly drive the transport unit 20. The linear driver 13 is controlled by the controller 160. A magnetic field is generated by supplying an electric current to the electromagnetic coil 12.

The transport unit 20 has two bases 31 and 32, link members 41 and 42, and the end effector 50 described above. The base 31 includes a first member 33 and a columnar second member 34 rotatably provided inside the first member 33. Similarly, the base 32 includes a first member 35 and a columnar second member 36 rotatably provided inside the first member 35. Although three transport units 20 are illustrated in the drawing, the number of transport units 20 may be one or more.

The bases 31 and 32 are configured so that a plurality of permanent magnets are arranged therein, and move the end effector 50 via the link members 41 and 42. Specifically, a plurality of permanent magnets 37 are arranged in the first members 33 and 35 of the bases 31 and 32, and a plurality of permanent magnets 38 are arranged in the second members 34 and 36.

And, the bases 31 and 32 are configured to magnetically levitate from a surface of the main body 11 by setting a direction of a current supplied to the electromagnetic coils 12 of the planar motor (the linear unit) 10 to a direction in which the magnetic field generated by the current repels the permanent magnets 37 and 38. The bases 31 and 32 are stopped from levitating by stopping the current to the electromagnetic coils 12, and are mounted on the floor of the vacuum transport chamber 120, that is, on the surface of the main body 11 of the planar motor 10.

Further, the bases 31 and 32 can be moved in the X direction, the Y direction, or a θ direction (rotation) along the surface of the main body 11 of the planar motor 10 in a state in which the bases 31 and 32 are magnetically levitated, and positions thereof can be controlled by individually controlling the current supplied from the linear driver 13 to the electromagnetic coils 12. In addition, an amount of levitation can be controlled by controlling the current. Further, by individually controlling the current supplied from the linear driver 13 to the electromagnetic coils 12, the second members 34 and 36 can be rotated with respect to the first members 33 and 35, for example, from a state of FIG. 4A to a state of FIG. 4B.

The link members 41 and 42 are respectively connected to the second members 34 and 36 via rotating shafts 43 and 44, and the link members 41 and 42 rotate as the second members 34 and 36 rotate. Thus, the end effector 50 can be expanded and contracted with respect to the bases 31 and 32.

FIGS. 2 and 5 show the state in which the end effector 50 is contracted, and the end effector 50 and the link members 41 and 42 are folded to overlap each other on the bases 31 and 32. Additionally, in this state, the bases 31 and 32 and the link members 41 and 42 are included in a region in which the wafer W on the end effector 50 is present when viewed in a plan view. When the transport unit 20 moves in the vacuum transport chamber 120, the end effector 50 is in a contracted state in this way.

FIGS. 6 and 7 show the state in which the end effector 50 and the link members 41 and 42 are extended from the bases 31 and 32. The end effector 50 can access the processing chamber 110 to deliver the wafer W thereto and therefrom by extending the end effector 50 and the link members 41 and 42 in this way when the transport unit 20 accesses the processing chamber 110 which is a wafer transport position.

Next, the operation of the substrate transport apparatus 150 configured in this way will be described.

In the substrate transport apparatus 150, the controller 160 controls the current supplied from the linear driver 13 of the planar motor (the linear unit) 10 to the electromagnetic coils 12 to generate a magnetic field which repels the permanent magnets 37 and 38, thereby magnetically levitating the bases 31 and 32. The amount of levitation at this time can be controlled by controlling the current.

The bases 31 and 32 can be moved along the surface of the main body 11 of the planar motor 10 (the floor of the vacuum transport chamber 120) to transport the wafer W on the end effector 50 by individually controlling the current supplied from the linear driver 13 to the electromagnetic coils 12 in the state in which the bases 31 and 32 are magnetically levitated.

As described above, the substrate transport using such a planar motor solves the problem of gas intrusion from the vacuum seal and the problem that the rotation and expansion and contraction movement of the transport robot are limited in the technology using the transport robot.

In particular, due to limitation of the rotation and the expansion and contraction movement of the transport robot, there is a problem that an installation area of the entire substrate processing system becomes large and it is difficult to reduce clean room costs, but such a problem can be alleviated by the transport technology using the planar motor.

That is, in the case of a substrate processing system having a plurality of processing chambers, a mounting position of the processing chamber is limited by a mounting position of the transport robot, and further, the vacuum transport chamber requires an area required for rotation and expansion and contraction of a robot arm, and a plurality of such vacuum transport chambers are required. Therefore, the installation area of the entire system becomes large. On the other hand, in the substrate transport using a planar motor as in Japanese Patent Application Publication No. 2018-504784, a degree of freedom in the mounting position of the processing chamber is high, and an area of the vacuum transport chamber can be reduced to some extent.

However, recently, with respect to a substrate processing system having a plurality of processing chambers, there is a demand for a further reduction in the installation area.

Therefore, in the embodiment, the bases 31 and 32 of the transport unit 20 include the first members 33 and 35 and the second members 34 and 36 which are rotatable with respect to the first members 33 and 35, and the end effector 50 is connected to the second members 34 and 36 via the link members 41 and 42.

Thus, the current supplied from the linear driver 13 to the electromagnetic coils 12 can be individually controlled to rotate the second members 34 and 36 with respect to the first members 33 and 35, and the end effector 50 can be expanded and contracted via the link members 41 and 42.

As shown in FIGS. 2 and 5, when the end effector 50 is contracted, the end effector 50 and the link members 41 and 42 can be folded and overlap each other on the bases 31 and 32. Then, in this state, when viewed in a plan view, the bases 31 and 32 and the link members 41 and 42 are included in the region in which the wafer W on the end effector 50 is present, and the area occupied by the transport unit 20 can be minimized.

Then, in this state, a space for the transport unit 20 to move in the vacuum transport chamber 120 can be reduced by moving the transport unit 20 in the vacuum transport chamber 120 by linear driving to transport the wafer W. Therefore, the vacuum transport chamber 120 can be made smaller, and the installation area of the substrate processing system 100 itself can be made smaller.

When the wafer W is delivered with respect to the processing chamber 110, which is the wafer transport position, by the transport unit 20, the movement of the bases 31 and 32 is stopped in a state in which the end effector 50 faces the processing chamber 110. Then, as shown in FIGS. 6 and 7, the end effector 50 and the link members 41 and 42 are extended from the bases 31 and 32 to allow the end effector 50 to access the processing chamber 110 by rotating the second members 34 and 36 with respect to the first members 33 and 35.

An extension operation of the end effector 50 at this time will be described with reference to FIGS. 8A to 8D. FIG. 8A is a state in which the end effector 50 is contracted, and the bases 31 and 32 and the link members 41 and 42 are included in the region in which the wafer W on the end effector 50 is present when viewed in a plan view. From this state, the current supplied from the linear driver 13 to the electromagnetic coils 12 is individually controlled to move the first members 33 and 35 and the second members 34 and 36 of the bases 31 and 32, and as shown in FIG. 8B and furthermore in FIG. 8C, the bases 31 and 32 are rotated outward, and the end effector 50 is moved straight. Then, the bases 31 and 32 are further rotated to move the end effector 50 straight, and finally, as shown in FIG. 8D, the end effector 50 and the link members 41 and 42 are extended from the bases 31 and 32.

As shown in FIGS. 9A to 9D, a guide member may be provided to stably move the end effector 50. In this case, the bases 31 and 32 are rotated outward from the state in which the end effector 50 is retracted shown in FIG. 9A, and as shown in FIG. 9B and furthermore in FIG. 9C, when the bases 31 and 32 are rotated outward to move the end effector 50 straight, the end effector 50 is guided by the guide member 60. Then, the bases 31 and 32 are further rotated to move the end effector 50 straight along the guide member 60, and finally, as shown in FIG. 9D, the end effector 50 and the link members 41 and 42 are extended from the bases 31 and 32.

As described above, in the substrate transport apparatus 150 of the present embodiment, the end effector 50 can be easily moved straight by simply individually controlling the current supplied from the linear driver 13 to the electromagnetic coils 12 and moving the first members 33 and 35 and the second members 34 and 36 of the bases 31 and 32. Further, since the end effector 50 is extended to the processing chamber 110 only when the wafer W is delivered to and from the processing chamber 110, the extension operation of the end effector 50 does not affect the area where the wafer W is installed in the vacuum transport chamber 120.

<Another Example of Substrate Processing System>

Figure 10:
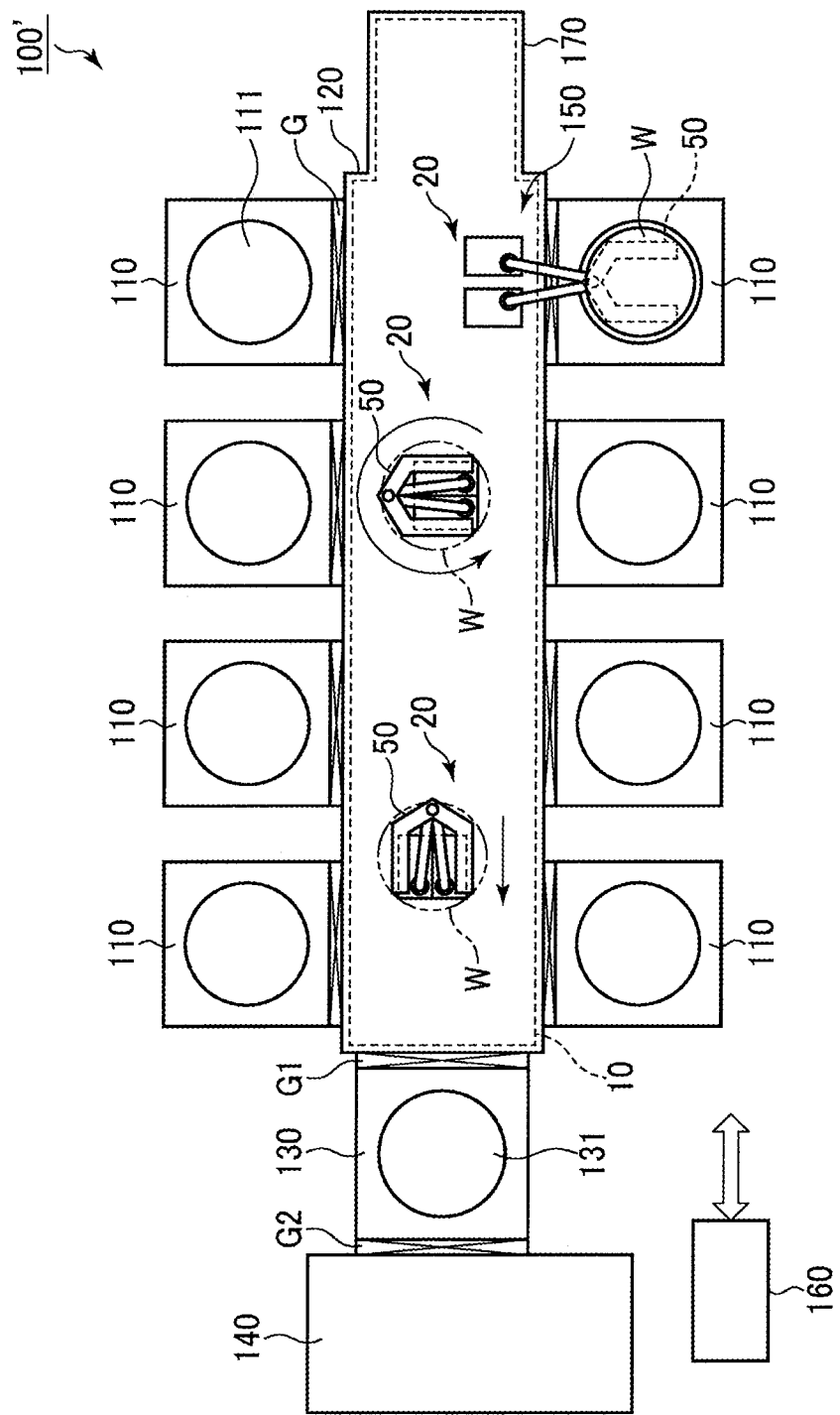
FIG. 10 is a schematic plan view showing another example of the substrate processing system.

FIG. 10 is a schematic plan view showing another example of the substrate processing system.

Similar to the substrate processing system 100 of FIG. 1, a substrate processing system 100' of this example continuously performs desired processes on a plurality of substrates. Since a basic configuration of the substrate processing system 100' is the same as that of the substrate processing system 100, the same as the substrate processing system 100 will be designated by the same reference numerals, and the description thereof will be omitted.

The substrate processing system 100' of this example is different from the substrate processing system 100 in that the vacuum transport chamber 120 has a buffer chamber 170 at a position facing the load lock chamber 130.

By providing the buffer chamber 170, in the case a plurality of transport units 20 are provided, one of the transport units 20 can be retracted into the buffer chamber 170 and the transport units 20 can be prevented from interfering with one another. The wafer W can be transported more smoothly.

<Other Applications>

Although the embodiments have been described above, the embodiments disclosed this time should be considered to be exemplary in all respects and not restrictive. The above embodiments may be omitted, replaced or modified in various forms without departing from the scope of the appended claims and their gist.

Figure 11:
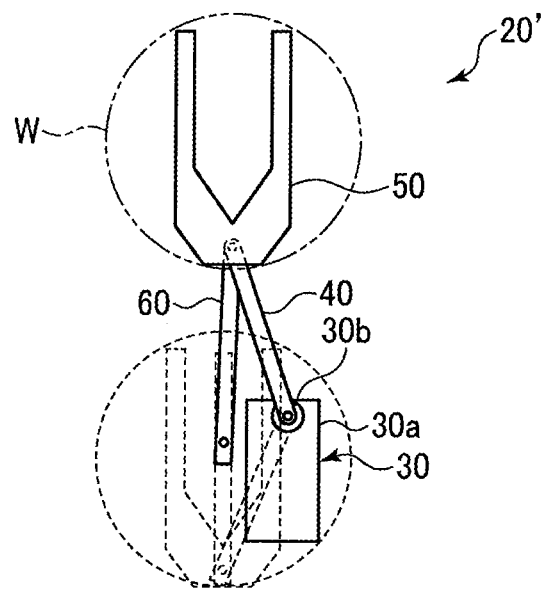
FIG. 11 is a plan view showing another example of the transport unit.
Figure 12:
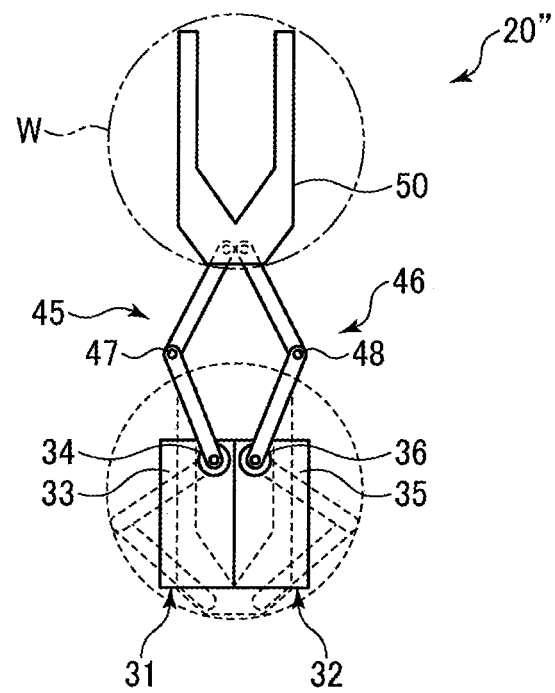
FIG. 12 is a plan view showing still another example of the transport unit.

For example, in the above-described embodiment, although a unit having the end effector 50, two bases 31 and 32, and link members 41 and 42 connecting them was used as the transport unit 20 of the substrate transport apparatus, the present disclosure is not limited thereto. For example, as shown in FIG. 11, a transport unit 20' having one base 30 and one link member 40 may be used. Also in the transport unit 20' in FIG. 11, the base 30 has a first member 30a for X-Y movement and a second member 30b for expanding and contracting the end effector. Further, a guide member 60 for stably moving the end effector 50 is provided. Further, as shown in FIG. 12, a transport unit 20" having articulated link members 45 and 46 having joints 47 and 48 may be provided instead of the link members 41 and 42. A so-called frog leg type expansion and contraction operation can be performed using the articulated link members 45 and 46. Further, a link mechanism which is displaced in a horizontal direction and a link mechanism which is displaced in a height direction may be combined.

Further, although the case in which a semiconductor wafer (a wafer) is used as the substrate is shown, the present disclosure is not limited to the semiconductor wafer, and other substrates such as a flat panel display (FPD) substrate and a ceramic substrate may be used.

What is claimed is:

1. A substrate transport apparatus for transporting a substrate to a substrate transport position, the apparatus comprising:

a transport unit including a substrate holder configured to hold the substrate, a base having a plurality of magnets therein and configured to move the substrate holder, and a link member configured to connect the substrate holder to the base; and a planar motor having a main body and a plurality of electromagnetic coils arranged in the main body, wherein the electromagnetic coils are supplied with power to magnetically levitate and also linearly drive the base, wherein the base includes a first member forming an exterior of the base and a second member having a columnar shape and rotatably provided inside the first member, and the magnets are provided inside the first member and the second member, the link member is connected to the second member, the number of the bases included in the transport unit is two, and the planar motor rotates the second member with respect to the first member and moves the substrate holder away from or towards the base via the link member by rotating the second member, and wherein the second member of each of the bases moves in a linear path toward or away from each other.

2. The substrate transport apparatus of claim 1, wherein, when the substrate holder is moved towards the base, the base, the link member, and the substrate holder enter a state of vertically overlapping one another, and the base is linearly driven in said state.

3. The substrate transport apparatus of claim 2, wherein, in a state in which the substrate holder is moved towards the base, the base and the link member are configured to be included in a region in which the substrate held by the substrate holder is present when viewed in a plan view.

4. The substrate transport apparatus of claim 1, wherein, when the substrate holder accesses the substrate transport position, the substrate holder is in a state of being moved away from the base.

5. The substrate transport apparatus of claim 1, wherein the number of the link members included in the transport unit is two, and each of the link members connects the second member of each of the bases to the substrate holder.

6. The substrate transport apparatus of claim 5, wherein the link member has a joint and performs a frog leg type expansion and contraction operation.

7. The substrate transport apparatus of claim 1, wherein the transport unit further includes a guide member configured to guide the substrate holder and comprising an elongate part along which the substrate holder moves while the substrate holder is moved away from or towards the base.

8. The substrate transport apparatus of claim 1, wherein the transport unit is provided in a transport chamber to which a processing chamber configured to process the substrate is connected, the substrate transport position is the processing chamber, and the main body of the planar motor constitutes a bottom wall of the transport chamber.

9. A substrate transport method for transporting a substrate to a substrate transport position,
wherein the method uses a substrate transport apparatus which includes: a transport unit including a substrate holder configured to hold the substrate, a base having a plurality of magnets therein and configured to move the substrate holder, and a link member configured to connect the substrate holder to the base; and a planar motor having a main body and a plurality of electromagnetic coils arranged in the main body, wherein the electromagnetic coils are supplied with power to magnetically levitate and also linearly drive the base, wherein the base includes a first member forming an exterior of the base and a second member having a columnar shape and rotatably provided inside the first member, and the magnets are provided inside the first member and the second member, the link member is rotatably connected to the second member, and the linear driver planar motor rotates the second member with respect to the first member, the number of the bases included in the transport unit is two, and the planar motor rotates the second member with respect to the first member,
the method comprising:
moving the substrate holder on which the substrate is held towards the base, and linearly driving the base to transport the substrate in a state in which the base, the link member, and the substrate holder vertically overlap one another; and
rotating the second member with respect to the first member by the planar motor to move the substrate holder on which the substrate is held away from the base via the link member, and delivering the substrate to and from the substrate transport position when the substrate is transported to a position corresponding to the substrate transport position, and
wherein the second member of each of the bases moves in a linear path toward or away from each other.

10. The substrate transport method of claim 9, wherein, in a state in which the substrate holder is moved towards the base, the base and the link member are configured to be included in a region in which the substrate held by the substrate holder is present when viewed in a plan view.

11. The substrate transport method of claim 9, wherein the transport unit is provided in a transport chamber to which a processing chamber configured to process the substrate is connected, the substrate transport position is the processing chamber, and the main body of the planar motor constitutes a bottom wall of the transport chamber.

12. A substrate processing system comprising:
a processing chamber configured to process a substrate;
a transport chamber to which the processing chamber is connected; and
a substrate transport apparatus configured to transport the substrate in the transport chamber and to deliver the substrate to and from the processing chamber,
wherein the substrate transport apparatus includes a transport unit including a substrate holder configured to hold the substrate, a base having a plurality of magnets therein and configured to move the substrate holder, and a link member configured to connect the substrate holder to the base, and a planar motor having a main body and a plurality of electromagnetic coils arranged in the main body, wherein the electromagnetic coils are supplied with power to magnetically levitate and also linearly drive the base,
the base includes a first member forming an exterior of the base and a second member having a columnar shape and rotatably provided inside the first member, and the magnets are provided inside the first member and the second member,
the link member is connected to the second member,
the number of the bases included in the transport unit is two, and
the planar motor rotates the second member with respect to the first member and moves the substrate holder away from or towards the base via the link member by rotating the second member, and
wherein the second member of each of the bases moves in a linear path toward or away from each other.

13. The substrate processing system of claim 12, wherein, when the substrate holder is moved towards the base, the base, the link member, and the substrate holder enter a state of vertically overlapping one another, and the base is linearly driven in said state.

14. The substrate processing system of claim 13, wherein, in a state in which the substrate holder is moved towards the base, the base and the link member are configured to be included in a region in which the substrate held by the substrate holder is present when viewed in a plan view.

15. The substrate processing system of claim 12, wherein, when the substrate held by the substrate holder is delivered to and from the processing chamber, the substrate holder is in a state of being moved away from the base.

16. The substrate processing system of claim 12, wherein the main body of the planar motor constitutes a bottom wall of the transport chamber.

* * * * *